United States Patent [19]

Stahl

[11] Patent Number: 4,648,019
[45] Date of Patent: Mar. 3, 1987

[54] HIGH EFFICIENCY RINGING GENERATOR
[75] Inventor: Douglas C. Stahl, Scottsdale, Ariz.
[73] Assignee: GTE Communication Systems Corporation, Phoenix, Ariz.
[21] Appl. No.: 768,593
[22] Filed: Aug. 23, 1985
[51] Int. Cl.[4] .............................................. H03K 4/02
[52] U.S. Cl. ...................................... 363/43; 363/97; 307/270; 307/288
[58] Field of Search ..................... 363/43, 95, 97, 131; 307/270, 288

[56] References Cited
U.S. PATENT DOCUMENTS 3,614,589 10/1971 Ireland et al. ........................ 363/43
4,052,658 10/1977 Hucker ................................. 363/43
4,415,961 11/1983 Harmon Jr. ......................... 363/43
4,527,081 7/1985 Stewart .............................. 307/270

FOREIGN PATENT DOCUMENTS 0944025 7/1982 U.S.S.R. ............................... 363/43

Primary Examiner—Patrick R. Salce
Assistant Examiner—Emanuel Todd
Attorney, Agent, or Firm—Anthony Miologos; Peter Xiarhos

[57] ABSTRACT

An improved ringing generator is disclosed, for producing and transmitting an AC ringing voltage waveform to a subscriber line from a negative and positive DC voltage source. The ringing generator is characterized by a transformer having a primary winding and a secondary winding. The primary winding includes a plurality of taps dividing the primary winding into a plurality of winding segments. The secondary winding is connected to subscriber line via a filter network. Each winding segment is connected to a buffer-driver which has a first lead connected to the DC voltage source and a second lead connected to a source of control signals. Responsive to the control signals a selected pair of buffer-drivers are alternatively enabled connecting for a predetermined time period the associated coupling segments to the DC voltage source thereby, producing a switched ringing voltage waveform which is coupled to the secondary winding.

10 Claims, 3 Drawing Figures

HIGH EFFICIENCY RINGING GENERATOR

BACKGROUND OF THE INVENTION

This invention relates in general to telecommunications systems and more particularly to a DC to AC power converter for use as a ringing generator in telephone subscriber line circuits.

Ringing generators have been used for signaling calls between subscriber telephone instruments since the hand crank magneto generator of Alexander Graham Bell's day. In fact, magneto generators powered by −50 volt DC motors are still used for signaling calls today.

Today however, there is a need to reduce the power consumption of large telecommunication systems and therefore a need for increasing the efficiency of ringing generators.

To ensure continuity of service within a telecommunication system, all ringing generators are powered from a DC battery source. A battery voltage of −50 volts is generally used as the input voltage and an AC voltage of 85 to 100 volts RMS is generated at the output. The most common battery voltage is −50 volts for local subscriber lines and trunk circuits. Carrier systems for long distance toll communications will typically use +130 volts and −130 volts to power repeaters along the carrier span. The +/−130 voltages are usually derived from DC to DC converters powered from the −50 volt battery.

For example, current subscriber line circuitry powered by carrier spans that use repeater links are powered by the aforementioned +/−130 volts with the current limited to 200mA. Therefore, the power consumption of the subscriber line circuitry at the remote terminal is strictly limited. Since the ringing generator is the most power hungry piece of equipment at the remote site there is substantial interest in developing a ringing generator which is highly efficient.

One efficient ringing generator presently known is the suppressed carrier double sideband generator. This ringing generator uses a microprocessor which contains a look-up table. The converter uses the data in the look-up table to create a sinusoidal output. A digital-to-analog converter is used to create a dynamic signal which controls a pulse width modulator. The pulse width modulator has two phases which are controlled by the microprocessor. The phase information is fed through an isolation transformer where the original AC waveform is reconstructed by using a synchronous detector and filter. This particular ringing generator can achieve efficiencies of 85% however, these efficiencies are gained at the expense of complexity (and thus reliability) as well as cost. Additionally, the timing of the microprocessor, switches and synchronous detector of this converter is quite critical, and can present a number of design problems.

Another efficient ringing generator presently known is the Cuk converter. The Cuk converter uses a much simpler converter topology than the suppressed carrier double sideband generator described above and has attained efficiencies of over 90%. The Cuk converter includes a transistor which is fed a pulse width modulated square wave that varies according to the amplitude of the sine wave that the converter is trying to simulate. The disadvantage to this type of converter is the large size of the capacitors necessary, (typically 4,700uF or larger) to achieve high efficiencies. The Cuk converter is considered a capacitive energy transfer converter and the value of the capacitors is intrinsic to its design.

It therefore becomes the object of the present invention to provide a new and efficient means for generating ringing voltages to subscriber lines without any of the disadvantages mentioned above.

SUMMARY OF THE INVENTION

In accomplishing the object of the present invention there is provided an improved ringing generator for producing and transmitting an AC ringing voltage waveform to a subscriber line from a negative and positive DC voltage source.

The ringing generator of the present invention comprises, coupling means including a first coupling section and a second coupling section. The first coupling section includes a plurality of inputs dividing the first coupling section into a plurality of coupling segments. The second coupling section is normally connected to the subscriber line via a filter network.

The present invention further includes a plurality of switching means. Each switching means includes an input connected to the DC voltage source, an output connected to a respective one of the first coupling means inputs and an enable means connected to a source of control signals.

The AC ringing voltage waveform is produced in response to the control signals alternatively enabling a selected pair of switching means. The selected pair of switching means are enabled for a predetermined period of time thereby, connecting an associated coupling segment to the DC voltage source. The switching in and out of selected coupling segments by the switching means produces and couples to the second coupling section an AC ringing voltage waveform which is transmitted to the subscriber line via the filter network.

A BRIEF DESCRIPTION OF THE DRAWINGS

DESCRIPTION OF THE PREFERRED EMBODIMENT

The ringing generator of the present invention uses switch mode technology in a rather unique way. Instead of using a high frequency pulse width modulated voltage through a filter, as is more common in prior art ringing generators, the present invention switches transformer windings to provide a stepped voltage that can be bidirectional. The advantage of such a switching topology is its simplicity, small size and low cost of the components that it uses.

Figure 1:
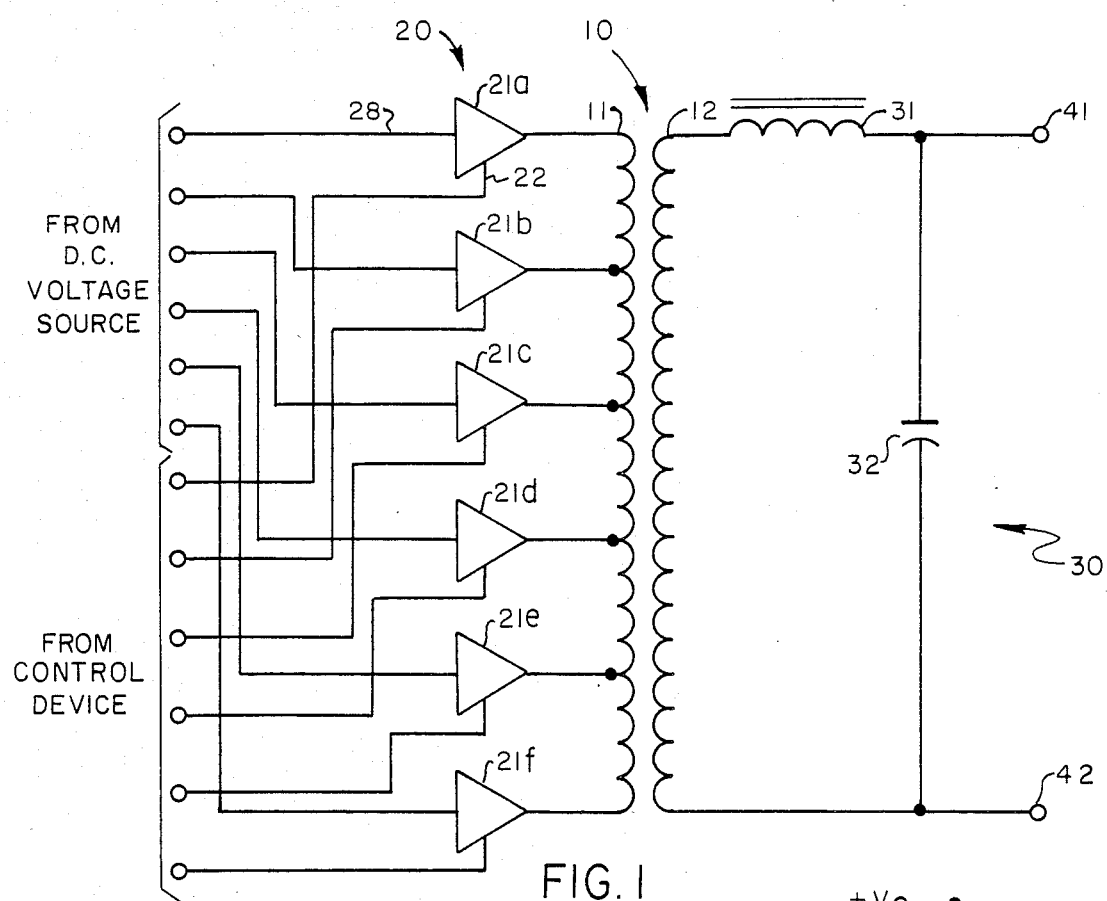
FIG. 1 is a schematic representation of the ringing generator in accordance with the present invention.

Turning now to FIG. 1 it can be seen that the invention is comprised of three distinct component groups. A multi-tapped transformer 10, a set of drivers 20, and an output filter 30.

The Transformer provides isolation and the capability to increase or decrease the magnitude of the output voltage according to its winding ratio. Traditionally, the need for isolation has been based on the application of a −50 volt DC bias to one side of the secondary (or output) winding of a transformer. The result appeared on the other side of the secondary winding. The zero crossing point of the complete ringing waveform then occurs at −50 volts. The winding ratio of a transformer is usually fixed. If 1 volt, for example, is applied to the input of the primary winding, then a fixed voltage can be expected across the secondary winding. This invention, however, uses a variable winding ratio where the primary winding 11 has several taps. Each individual tap is driven by a separate switching buffer-driver 21a–21f and therefore the output voltage across terminals 41, 42 will vary according to which buffer-driver is conducting.

The output filter 30 is comprised of inductors and capacitors which are represented by components 31 and 32 respectively of the simple circuit of FIG. 1. The output filter 30 is used to reduce the high frequency by-products of the switching waveform. The present invention does not require or use diodes, transistors or other active components on the secondary side of the transformer 10 and therefore, presents a completely passive network at its output.

Figure 2:
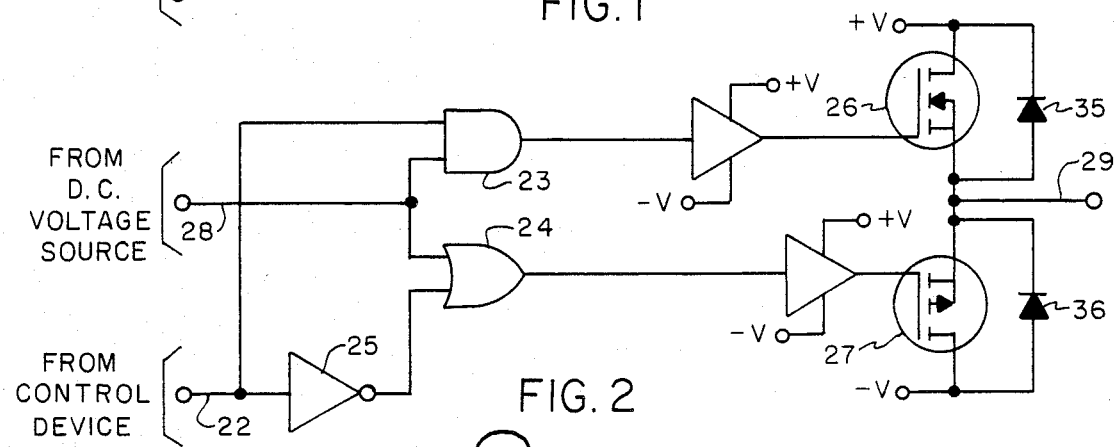
FIG. 2 is a schematic representation of a typical buffer-driver shown in FIG. 1.

Turning now to FIG. 2, the implementation of the buffer-drivers 20 is shown. Essentially each buffer-driver 21a–21f acts as a high voltage tri-state buffer. The enable lead 22 via a logic network comprised of gates 23, 24 and 25 will turn on one of two power transistors 26 or 27. The output present on lead 29 will change from a high impedance state to either a high or low voltage depending on the voltage being applied to input lead 28. The complementary transistors 26 and 27 are in a so-called totem pole configuration and can be either bipolar or MOSFET types.

As mentioned earlier the buffer-driver must simulate three state logic, that is, it must be able to switch to the positive supply rail (usually ground), the negative supply rail (usually −50 volt battery) and to a high impedance state. When the buffer-driver is either at the positive or negative rail only one transistor is on, when the buffer-driver is in the high impedance state neither transistor is on.

The diodes 35 and 36 connected to transistors 26 and 27 respectively, allows current to flow in the direction opposite to the direction that the transistor would normally conduct. This ensures the capability of the drivers to be current bidirectional and therefore, making the output of the ringing generator current bidirectional.

It should be noted that even though each buffer-driver 21a–21f of the present invention is shown constructed from discrete components, it will be well understood by those skilled in the art that the components shown comprising each buffer-driver could be packaged in an integrated circuit. Furthermore, because switching transistors ordinarily dissipate little power i.e. heat, it is quite possible to put several high voltage transistors in a dual-in-line package at a reasonable cost.

With renewed reference to FIG. 1, an example of the operational use of the present invention will be given. In this example the invention will be used as a square wave generator using just two of the buffer-drivers 20. The rest of the drivers are disabled via respective leads 22 and remain in a high impedance state and therefore isolated and floating. While one buffer-driver is alternating between positive and negative supplies applied via lead 28, a second complimentary buffer-driver is also alternating between positive and negative supplies simultaneously, but with opposite polarity. The resulting switched voltage waveform appears at the secondary winding 12 where it is filtered by filter components 31 and 32 to reduce its harmonic content and is output across terminals 41 and 42. Given a constant positive and negative supply voltage, it is possible to vary the amplitude of the square wave output voltage by using a different set of drivers. In effect, the winding ratio of the transformer is changed, with the output voltage changing as a result.

The change in the winding ratio is perhaps the best descriptive explanation of how the invention derives a varying voltage from a DC source. The square wave generator described previously wasted too much power in generating harmonics. Approximately 20% of the power of a square wave is in higher harmonics. Since a subscriber instrument's mechanical ringer will operate only at the fundamental frequency the higher harmonics represent wasted energy.

Therefore, by using a stepped voltage source, it is possible to reduce the percentage of harmonic content and provide more useful energy to the subscribers mechanical ringer. The stepped voltage is produced by first turning on the buffer-drivers 21a and 21f on the outermost set of windings. Then, as the buffer-drivers on the inner windings are progressively turned on (21b and 21e, etc.), the output voltage will step up to a higher voltage. It should be noted that since only two buffer-drivers are active at any one time, the buffer-driver that was turned on first is in a high impedance state at the most positive incursion of the voltage waveform. The turning on and off of each buffer-driver can be readily accomplished with the aid of a control device which can be programmed with the proper sequence required for the AC waveform generation.

Figure 3:
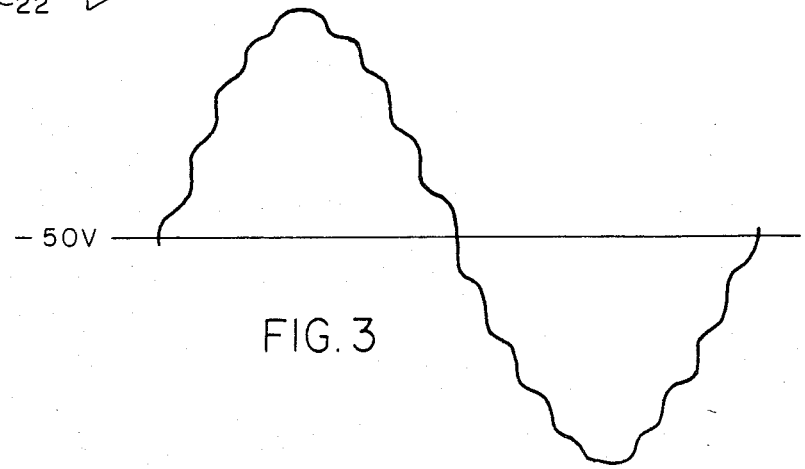
FIG. 3 is a representation of the waveform representative of the output signal generated by the present invention.

To step the voltage down, the drivers on the innermost set of windings 21c and 21d are turned on first with the remainder of the buffer-drivers progressively turned on until the outermost buffer-drivers 21a and 21f are activated. The routine of the just described sequence will produce a switched output voltage of one polarity only. The stepped voltage for the opposite polarity can now be generated by using the switched enabling sequence described earlier. FIG. 3 illustrates the final AC ringing waveform after filtering.

A more practical approach to sequencing the buffer-drivers is to let one buffer-driver at either end of the outermost windings be active at all times thereby, letting the other buffer-drivers turn on and off in a sequence that changes the winding ratio one step at a time.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. An improved ringing generator for producing and transmitting an AC ringing voltage waveform to a subscriber line from a negative and positive DC voltage source comprising:

coupling means having a first coupling section and a second coupling section, said first coupling section including a plurality of inputs dividing said first coupling section into a plurality of coupling segments and said second coupling section connected to said subscriber line;

a plurality of switching means, each switching means including an input connected to said DC voltage source, an output connected to a respective one of said first coupling means inputs and enabling means connected to a source of control signals; and, responsive to said control signals a selected pair of switching means is alternatively enabled connecting for a predetermined period an individual one of said plurality of coupling segments to said DC voltage source producing and coupling to said second coupling section said AC ringing voltage waveform whereby, said waveform is transmitted to said subscriber line.

2. The improved ringing generator as claimed in claim 1, wherein: said coupling means is a transformer and said first coupling section is the primary winding of said transformer and said second coupling means is the secondary winding.

3. The improved ringing generator as claimed in claim 2, wherein: said plurality of inputs are winding taps and said coupling segments comprise winding segments dividing said primary winding.

4. The improved ringing generator as claimed in claim 2, wherein: said secondary winding includes a filter network comprising of at least one inductor and capacitor in series and arranged to filter said AC ringing voltage waveform before it is transmitted to said subscriber line.

5. The improved ringing generator as claimed in claim 1, wherein: said switching means comprises a buffer-driver including first and second transistors and said first transistor is arranged to turn on when a positive voltage is present on said input and alternatively said second transistor is arranged to turn on when a negative voltage is present on said input.

6. The improved ringing generator as claimed in claim 5, wherein: each of said buffer-drivers include said enabling means and said enabling means comprises a plurality of logic devices connected to said control device and to said first and second transistors whereby responsive to said control signals each of said buffer-drivers assumes a non-conducting high impedance state or alternatively a conducting state.

7. The improved ringing generator as claimed in claim 6, wherein: in said conducting state said first and second transistors couple a positive or negative voltage respectively to said second coupling means responsive to the polarity of said DC voltage applied to said buffer-driver input.

8. An improved ringing generator for producing and transmitting an AC ringing voltage waveform to a subscriber line from a negative and positive DC voltage source comprising:

a transformer having a primary winding and a secondary winding, said primary winding including a plurality of taps dividing said primary winding into a plurality of winding segments;

a filter network connected to said secondary winding and said secondary winding connected to said subscriber line;

a plurality of buffer-drivers, each buffer-driver including an input connected to said DC voltage source, an output connected to a respective one of said primary winding taps and an enable input connected to a source of control signals; and, responsive to said control signals a selected pair of buffer-drivers are alternatively enabled connecting for a predetermined period an individual one of said plurality of coupling segments to said DC voltage source producing and coupling to said secondary winding said AC ringing voltage waveform whereby, said waveform is passed to said subscriber line via said filter network.

9. The improved ringing generator as claimed in claim 8, wherein: said filter network is comprised of at least one inductor and capacitor in series.

10. The improved ringing generator as claimed in claim 8, wherein: each buffer-driver includes a plurality of logic devices connected to said enable input and to said buffer-driver input and said logic devices including outputs connected to first and second transistors whereby, responsive to said control signals applied to said enable input said logic devices retain said first and second transistors in a high impedance state and alternatively turn said first transistor on or said second transistor on in response to a positive or negative voltage respectively, applied to said buffer-driver input.

* * * * *